United States Patent [19]

Jamison et al.

[11] Patent Number: 4,783,719

[45] Date of Patent: Nov. 8, 1988

[54] TEST CONNECTOR FOR ELECTRICAL DEVICES

[75] Inventors: John W. Jamison, Palm Springs; Robert E. Allen, Mission Viejo, both of Calif.

[73] Assignee: Hughes Aircraft Company, Los Angeles, Calif.

[21] Appl. No.: 5,054

[22] Filed: Jan. 20, 1987

[51] Int. Cl.$^4$ ............................................. H05K 01/18
[52] U.S. Cl. .................................. 361/398; 324/537; 174/52 FP; 361/408
[58] Field of Search ............... 361/398, 406, 408, 404, 361/414; 174/52 FP; 324/537, 73 PC

[56] References Cited

U.S. PATENT DOCUMENTS

| | | | |
|---|---|---|---|
| 3,221,286 | 11/1965 | Fedde | 361/398 X |
| 3,271,627 | 9/1966 | McDougal | 361/408 |
| 3,629,787 | 12/1971 | Wilson | 361/398 X |
| 3,967,162 | 6/1976 | Ceresa et al. | 361/398 |
| 4,056,773 | 11/1977 | Sullivan | 324/73 PG |
| 4,169,642 | 10/1979 | Mouissie | 361/398 X |
| 4,249,302 | 2/1981 | Crepeau | 361/414 X |
| 4,360,858 | 11/1982 | Fahling | 361/398 X |
| 4,390,220 | 6/1983 | Bansutti | 174/52 FP X |
| 4,509,099 | 4/1985 | Takamatsu et al. | 361/398 X |
| 4,602,317 | 7/1986 | Rovnyak et al. | 361/398 X |

Primary Examiner—R. R. Kucia
Attorney, Agent, or Firm—A. W. Karambelas

[57] ABSTRACT

An improved test apparatus is disclosed for testing leadless IC chip carriers or IC dies. The apparatus employs a flexible film on which is imprinted a conductor line pattern terminated in a plurality of raised conductive pads. The line pattern is readily formed on the film surface using photolithographic techniques. The conductive pads are arranged on the film surface in such a way as to conform to the positioning of the edge contact terminals of the chip carrier. A frame structure is provided for resiliently urging the chip carrier against the surface of the film, with the edge terminals of the chip carrier in electrical contact with the raised pads on the film. The conductor lines on the film are also terminated in raised pads, which are urged against a printed wire pattern on a rigid circuit board, which provides connections to the chip carrier test equipment. Thus, electrical contact is made to the chip carrier without the use of wire bonds or solder connections.

16 Claims, 5 Drawing Sheets

TEST CONNECTOR FOR ELECTRICAL DEVICES

BACKGROUND OF THE INVENTION

The present invention relates to text fixtures for conducting electrical testing of electrical devices such as integrated circuit dies and leadless integrated circuit carriers, and more particularly to an improved apparatus for providing electrical connections to such devices without the use of fragile wire fingers or wire bond connections.

IC dies are formed when a multiple circuit substrate is scribed and cut into individual dies or chips. Each die has a plurality of terminal pads formed on a surface thereof, to which electrical connections are made to connect the IC die into a circuit.

Leadless integrated circuit (IC or "chip") carriers are in widespread use for mounting IC dies. These chip carriers typically are fabricated from ceramic, and have a substantially planar configuration, with a plurality of closely spaced contact terminals formed around the external periphery of the carrier. A printed wiring pattern is formed on an upper surface of the chip carrier. The IC die is bonded to a surface of the carrier, with electrical terminal being made between contact pads on the IC die and pad locations on the printed wiring pattern, e.g., by wirebonds. The wiring pattern connects the pad locations to predetermined leadless carrier terminals, typically located on the external periphery of the chip carrier.

Leadless chip carriers are conventionally soldered onto a printed circuit board, with the peripheral chip terminals soldered at predetermined locations on the board printed wiring diagram. However, prior to mounting the chip carrier, it is desirable to test the chip carrier and the IC die(s) mounted on the chip carrier to determine that the IC die is functional and that electrical continuity exists between the chip terminal pads and the printed wiring pattern on the surface of the chip carrier.

In the past, test fixtures have been used which employ wire fingers or wiskers arranged in the peripheral configuration of the carrier to be tested. As the leadless chip carrier is inserted into the fixture, the peripheral contact terminals of the carrier are brought into electrical contact with the wire fingers of the fixture. These conventional test fixtures are expensive and the wire fingers are fragile. Moreover, a different fixture configuration is required for each type of device to be tested, since electrical contacts are achieved by the matching of the locations of the wire fingers to the peripheral contact terminal configuration of the chip carrier. Since a typical center-to-center spacing of the carrier contacts is 0.020 inches, with some forty to sixty-odd terminals per side of the carrier, the complexity of the conventional test fixture, with one wire finger or wisker corresponding to each contact terminal on the chip carrier, may be readily appreciated.

It would therefore represent an advance in the art to provide a connector apparatus for testing leadless chip carriers and associated IC dies which does not employ wire fingers or wire bonding to make electrical contact with the carrier, and which is relatively inexpensive and rugged.

SUMMARY OF THE INVENTION

The foregoing and other objects and advantages are provided by connector apparatus embodying the present invention providing electrical connections to electrical devices. In one preferred embodiment for testing leadless chip carriers, the connector apparatus comprises a flexible film having a plurality of conductive raised pads formed thereon and extending above the surface of the film in a pattern corresponding to the terminal pattern of the chip carrier, with a plurality of conductor lines connecting to respective ones of the conductive raised pads.

The connector apparatus also includes means for resiliently urging the flexible film against the surface of the chip carrier with respective ones of the raised pads aligned with corresponding ones of the chip carrier terminals so that electrical contact is achieved between the carrier terminals and the raised pads of the film.

The connector apparatus further comprises means for electrically connecting to the respective conductive lines formed on the film to provide electrical contact to the chip carrier terminals.

In a second embodiment, the connector apparatus is particularly adapted for testing IC dies.

BRIEF DESCRIPTION OF THE DRAWINGS

These and other features and advantages of the present invention will become more apparent from the following detailed description of exemplary embodiments thereof, as illustrated in the accompanying drawings, in which.

DETAILED DESCRIPTION OF THE DISCLOSURE

Figure 1:
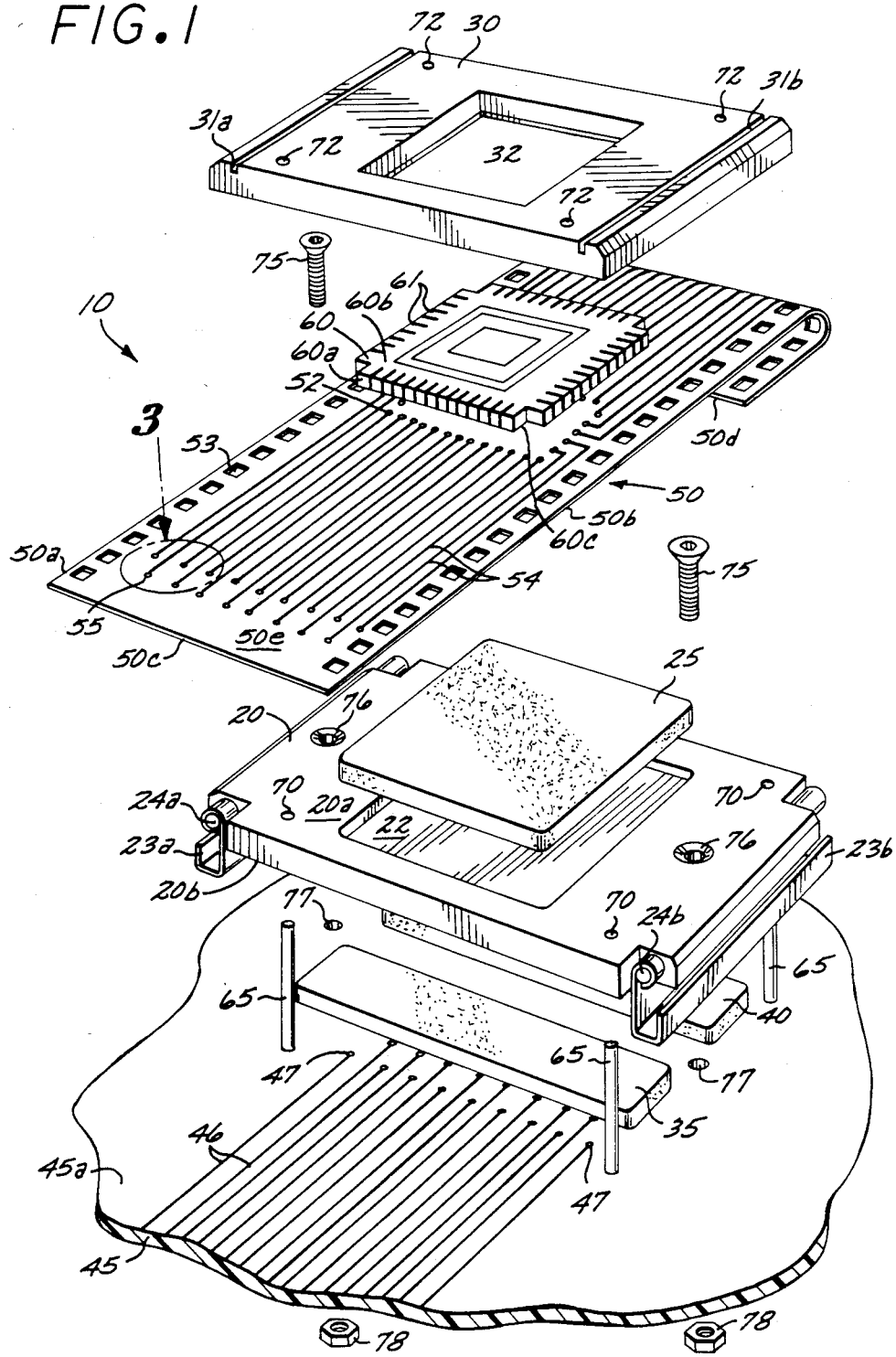
FIG. 1 is a diagrammatic exploded perspective view of a first embodiment of a connector apparatus embodying the present invention.

Referring to FIG. 1, an exploded perspective view of a connector apparatus 10 suitable for use as a test fixture apparatus for a leadless chip carrier 60 is shown. Leadless chip carriers, such as the chip carrier 60 shown in FIG. 1, comprise a plurality of closely spaced terminals 61 extending about the outer periphery 60a of the carrier. The terminals 61 are wrapped around the external periphery of the chip carrier 60, extending from the top surface 60b along the side periphery surface 60a and to the lower surface 60c of the chip carrier 60.

The apparatus 10 comprises connector fixture 20, top plate 30, flexible film layer 50 and interface board 45. Connector fixture 20 is fabricated from an insulator such as a paper based phenolic. The fixture 20 comprises an member having a recessed area 22 formed in its upwardly facing surface 20a. The area 22 is shaped in the configuration of the outer periphery of the chip carrier 60. A resilient layer 25 of high temperature rubber sized to fit into the recessed area 22 is also provided. The thickness of the resilient layer 25 substantially matches the depth of recess 22.

The top fixture plate 30 is also fabricated from an insulator such as a paper base phenolic. The top plate 30 comprises an open frame defining opening 32, formed in the configuration of the outer periphery of the chip carrier 60.

The apparatus 10 further comprises a flexible film 50 comprises a layer of flexible insulating material, such as the polyimide marketed under the name "Kapton," by E. I. DuPont Company. A plurality of conductor lines 54 are formed on the surface 50e of layer 50 in a wiring pattern; the conductor lines are terminated at each end by conductive raised pads 52 and 55, respectively. The pads 52 are disposed to make contact with terminals on the chip carrier 60; the pads 55 are disposed to make contact with conductor lines formed on the interface board 45, as will be described below. While the carrier 60 typically has terminals at all four sides, and the pads 52 are arranged to correspond to the locations of all the carrier terminals, the conductor lines 54 are arranged to connect to pads 55 located on only two sides or ends of the film 50 in this embodiment.

Figure 3:
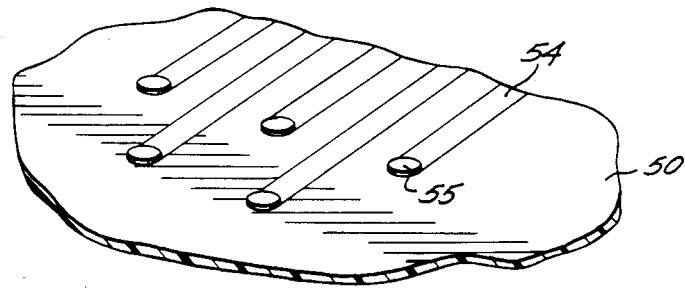
FIG. 3 is an enlarged perspective view of the portion of the flexible film enclosed within phantom circle 3 of FIG. 1 and showing the raised conductive dots formed thereon.

FIG. 3 is an enlarged perspective view of the portion of the film 50 enclosed within phantom circle 3 of FIG. 1, and illustrates the raised pads 55 in greater detail. In one particular exemplary embodiment, the pads have a diameter of about 0.005 inches, and extend above the surface of the film 50 about 0.001 inches.

Figure 2:
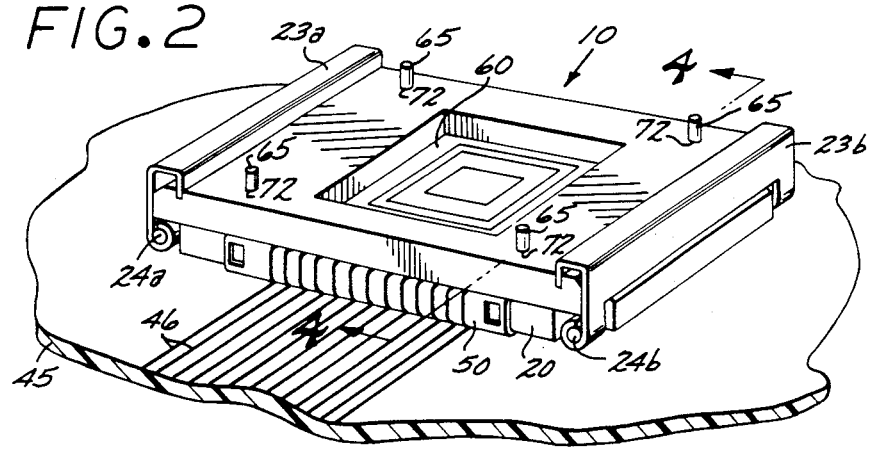
FIG. 2 is a perspective view of the assembled apparatus of FIG. 1.

The top plate 30 and fixture plate 20 are cooperatively arranged to sandwich the flexible film layer 50 and the test carrier 60 between them as shown in the exploded view of FIG. 1 and in FIG. 2, which show the apparatus in its assembled configuration. The fixture plate 20 is provided with a pair of opposed spring clips 23a and 23b which pivot about pins 24a and 24b. In the assembled configuration as shown in FIG. 2, the spring clips 23a, 23b are pivoted over the top edge surface of the top plate 30 and snap into corresponding grooves 31a, 31b to secure the assembly of elements 20, 25, 60 and 30 together.

Figures 6, 7:
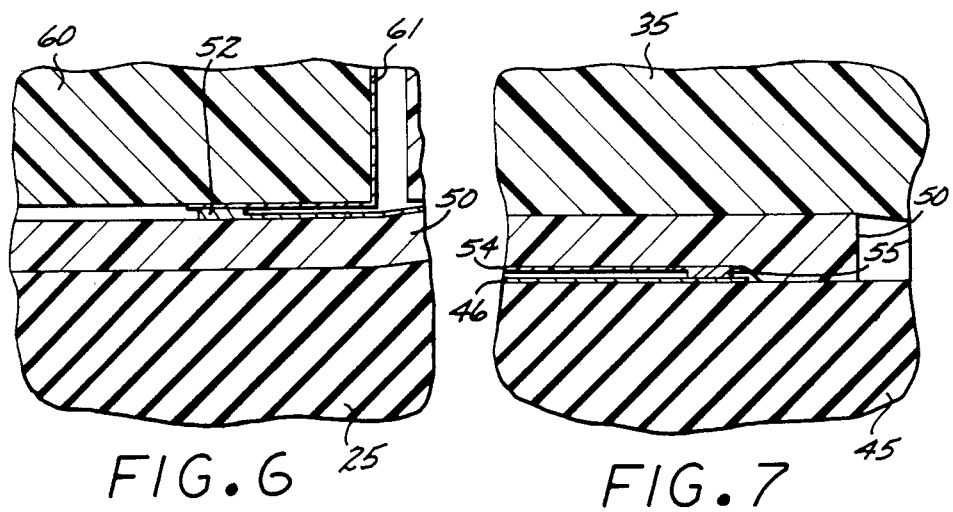
FIG. 6 is an enlarged cross-sectional view of the test fixture within the phantom circle 6 of FIG. 4, showing the engagement of a raised pad on the flexible film and a corresponding chip terminal.
FIG. 7 is an enlarged cross-section view of the portion of the connector apparatus within phantom circle 7 of FIG. 4 showing the engagement of a raised pad on the flexible film with a conductor line on an interface board.

The fixture plate 20, the resilient layer 25 and the top plate 30 provide a means for resiliently urging the flexible film against the lower surface 60c of the chip carrier 60 with the raised pads 52 aligned with corresponding ones of the pad terminals 61 so as to achieve electrical contact therebetween, as shown in FIG. 6. The flexibility of the film allows it to conform to non-planar device contours.

Figure 4:
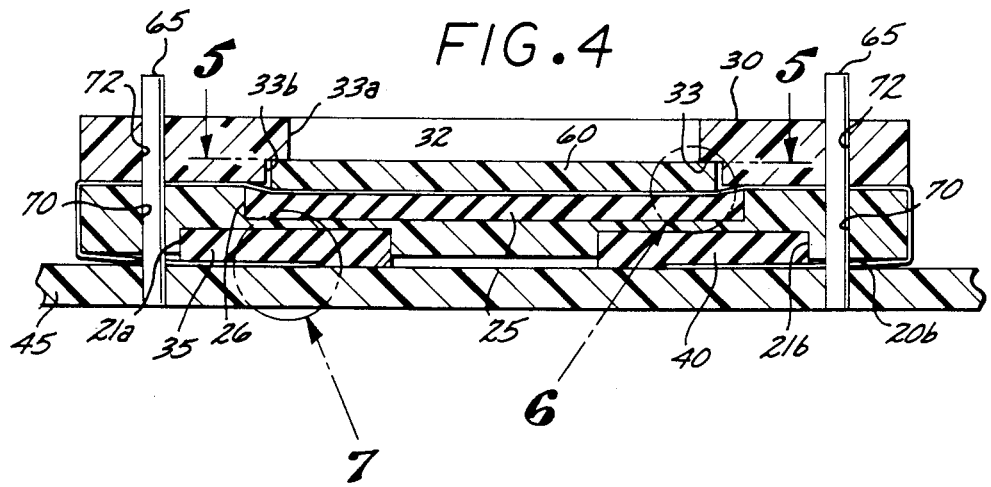
FIG. 4 is a cross-sectional view of the connector apparatus taken along line 4—4 of FIG. 2.

The apparatus 10 further comprises a pair of resilient blocks 35 and 40 fabricated of high temperature rubber. The blocks 35 and 40 are received in a pair of corresponding recessed regions 21a, 21b formed in lower surface of plate 20, as shown in FIG. 4. The ends of the flexible film 50 are folded under the fixture 20, as shown in FIGS. 2 and 4, so that the raised pads 55 are facing downwardly. With the pins 65 fitted through the corresponding openings 70 in member 20, holes 72 in member 30 and sprocket openings 53 (FIG. 1) in film 50, this assembly is then urged against the upper surface of the interface board 45. A plurality of threaded fasteners 75 are inserted though countersunk openings 76 formed in fixture 20 and through corresponding openings 77 formed in interface board 45, and are secured by nuts 78 to draw down securely against board 45 the assembly of the fixture 20 and the film 50. A printed wiring pattern is defined on the upper surface 45a of board 45, comprising a plurality of conductor lines 46 which are terminated in conductive pads 47. The conductor line pattern of the interface board 45 is arranged to conform to the respective locations of the raised pads 55 formed on film layer 50 when the ends of the film 50 are folded under the fixture plate 20. The blocks 21a and 21b provide a means of resiliently urging the conductive pads 55 against corresponding conductive pads 47 formed on board 45, as shown in FIG. 7. The lines 46 are in turn connected electrically to electronic test devices (not shown) for performing electrical testing of the chip carrier 60.

Pins 65 protruding from interface board 45 are received within openings 70 formed in connector fixture 20 and openings 72 formed in top plate 30 when the apparatus is assembled as shown in FIG. 2. The position of the film 50 is registered relative to the interface board 45 and fixture members 20 and 30 by pins 65, which are also fitted through predetermined ones of the sprocket openings 54 formed along the longitudinal edges of the film 50. Thus, the relative positions of the interface board 45, fixture members 20 and 30 and film 50 are aligned by the cooperation of the pins 65, the sprocket openings 54 and the openings 70 and 72.

FIG. 4 is a cross-sectional view of the assembly of FIG. 2, and illustrates the capturing of the chip carrier 60 and flexible film 50 between fixture plate 20 and top plate 30. The opening 32 formed in the top plate 30 is defined by an upper interior edge 33a of the frame plate 30. A downwardly-facing shoulder 33 is defined by the upper interior edge 33a and lower interior edge 33b. The peripheral edges of the chip carrier 60 are urged against the shoulder 33, thereby constraining the upward movement of carrier 60.

Figure 5:
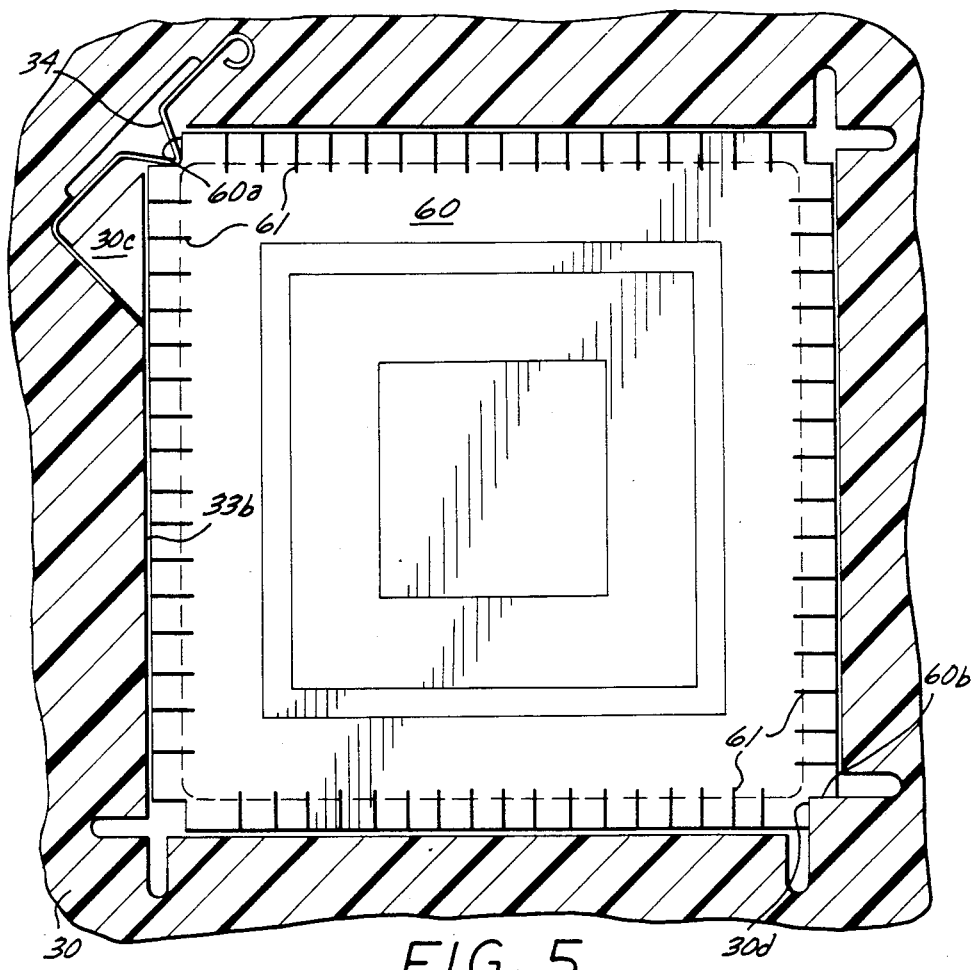
FIG. 5 is a longitudinal sectional view of the connector apparatus taken along line 5—5 of FIG. 4.

The cross-sectional view of FIG. 5 illustrates a means by which the location of the chip carrier 60 is registered and held within the opening 32. This means comprises a spring member 34 fitted within a corner recess 30c, which engages against a corner 60a of the chip carrier 60 and urges the opposing corner 60b of the chip carrier 60 against the protruding corner 30d of the top frame member 30. In this manner, the lateral position of the chip carrier 60 within opening 32 is registered with sufficient precision to align the peripheral terminals 61 with the position of the raised pads 52 on film 50. further, the spring 34 holds the carrier 60 in place in plate 30 during assembly of the apparatus 10, facilitating the ease of use of the apparatus.

The conductive lines 54 and raised pad 52 and 55 formed on flexible film layer 50 may be formed by use of photolithographic techniques. A preferred technique will now be described. Kapton film is commercially available in sprocketed strips of 0.003 inch thickness by 70 millimeter (mm) width, with one side having a deposited layer of copper formed thereon from the Rogers Corporation in Chandler, Ariz. This base element is cleaned and the copper-coated side is coated by a dry film photoresist, such as that sold by E. I. DuPont Company under the name "RISTON," to a thickness of about 0.019 inches.

The photoresist layer is then exposed through a negative mask network to define the wiring pattern by masking with the photoresist only those areas which are not to be conductive. The photoresist-patterned surface of the film is electroplated with a layer of tin-lead about 0.003 inches thick.

The photoresist is then stripped from the film surface, so that the tin-lead layer covers only the areas to be conductive on the surface. The tin-lead serves as the pattern-defining mask protecting the underlaying copper layer from the subsequent copper etching step, which selectively etches the copper layer away from the non-tin-lead covered surface areas of the film, using an etchant which reacts with copper but not with tin-lead.

At this point, the conductor line pattern has been defined. Since the patterned tin-lead layer still covers the areas from which the copper has been removed, the conductor line thickness may be increased if desired by electroplating. The tin-lead is subsequently stripped using a solvent which reacts with tin-lead but not with copper.

The next step is to coat the surface of the film with photoresist again to a thickness of about 0.019 inches. The photoresist is exposed through a negative mask or artwork which defines the conductive pads 52 and 55, and subsequently developed. The resulting photoresist layer is patterned with the size and locations of the conductive pads defined by openings in the photoresist layer. The film is then electroplated with copper to a thickness of about 0.001 inches, and in turn electroplated with gold to a thickness of about 0.000060 inches. The photoresist is then stripped to complete the fabrication of the film 50.

The apparatus 10 provides the capability of providing bondless electrical connections to the terminals of a leadless chip carrier without the use of wirebonding, fragile metal wisker contacts or solder connections. Further the apparatus of FIGS. 1-7 is relatively inexpensive to construct and is rugged and reliable in operation. The flexible films may be fabricated by use of the same artwork employed to fabricate the peripheral terminals on the leadless chip carrier, ensuring the accuracy of the placement of the raised conductive pads and conductor lines on the film. An additional advantage is the ease and low cost of replacing the film 50, once it wears out from use.

With the fixture 20 and film 50 aligned by pins 65 and secured to board 45 by fasteners 75 and 78, the apparatus 10 accommodates rapid insertion, testing and removal of the chip carriers 60. Insertion and removal is conveniently accomplished by use of the spring clips 23a and 23b to selectively secure the top plate 30 with the carrier 60 against film 50 and fixture 20, with the pins 65 serving to align the position of the top plate 30 with the film 50 and fixture 20. To replace the film, the fasteners 75 are removed to release the fixture 20 and film 50 from the secured position against the interface board 45.

While the embodiment of FIGS. 1-7 is particularly well suited for the testing of leadless chip carriers, the invention may be employed to make solderless touch connections to other electrical devices, such as integrated circuit dies, printed wiring boards and the like.

Figure 8:
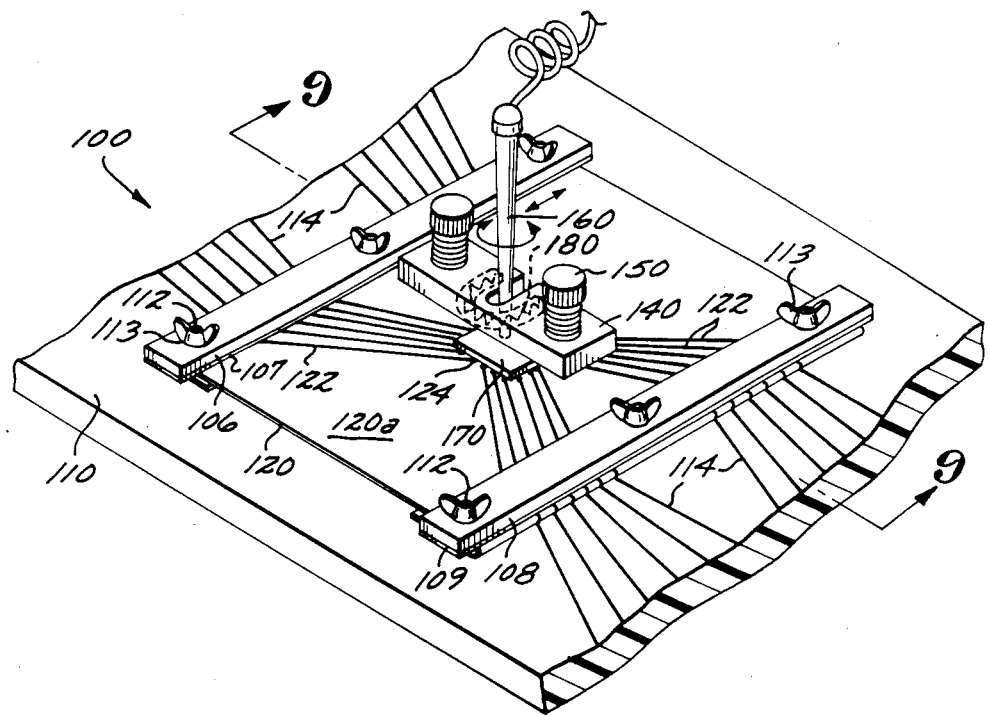
FIG. 8 is a perspective view of a second embodiment of a connector apparatus embodying the invention suitable for making electrical connections to an IC die.
Figure 9:
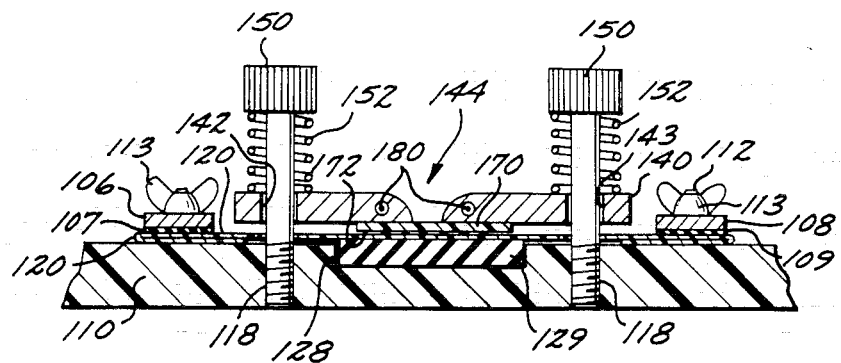
FIG. 9 is a cross-sectional view of the connector apparatus of claim 8 taken along line 9—9 of FIG. 8.
Figure 10:
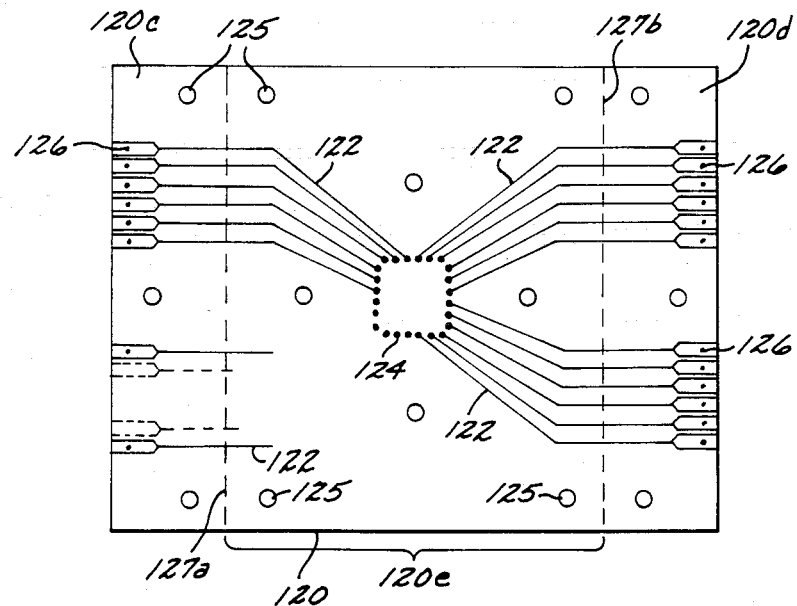
FIG. 10 is a top plan view of the flexible film employed with the connector apparatus of FIG. 8.

An alternate embodiment suitable for electrically testing IC dies is shown in FIGS. 8-10. The testing apparatus 100 is shown in perspective view in FIG. 8. In general, the apparatus comprises an interface board 110, a flexible film 120 having a pattern of conductor lines 122 formed thereon with a plurality of raised pads 124, holder bracket 140, indexing and alignment studs 150, and a vacuum stem 160. The apparatus is employed to make electrical contact with conductive terminal pads formed on the IC die 170.

The interface board 110 performs similar functions to the interface board 45 of the embodiment of FIGS. 1-7. The board 110 has a pattern of conductor lines 114 which are arranged to conform to the locations of certain raised pads 126 (FIG. 10) at the edge terminations of the conductor lines 122 of film 120 when the edges of the film are folded under in a manner similar to that described above regarding film 50 in FIGS. 1-7. The conductor lines 114 provide a means of electrically connecting electronic test equipment (not shown) to the raised pads 126 of the flexible film.

A pair of elongated pressure plates 106 and 108 are employed to compress the folded edges of the film 120 against the conductor wire pattern formed on the board 110. The lower surfaces of members 106 and 108 are covered with respective layers 107 and 109 of high temperature rubber (FIG. 9). These layers comprise a means of resiliently urging the film 120 against the board 110. Fasteners 113 secure the members 106 and 108 in position.

The flexible film 120 performs similar functions to the flexible film 50 of FIGS. 1-7, excepted that the edges of film 120 are not formed with the sprocket holes. The film 120 is provided with a plurality of distributed alignment openings 125 (FIG. 10), which receive the alignment pins 112 when the film 120 is positioned on board 110 as shown in FIGS. 8 and 9. The positions of the raised pads 124 conform to the location of the contact terminals (not shown) located on the lower surface 172 (FIG. 9) of the IC die 170. The pads 124 extend above the surface of the film 120 by about 0.001 to 0.002 inches, in one exemplary application. The die terminals are typically exposed portions of a metallization layer, which are exposed as a result of etching openings through a protective exterior oxide layer. Thus, for this example, the die terminals are beneath the level of the oxide layer, and the raised pads 124 should extend above the surface of the film 120 by a sufficient distance to reach the die terminals.

The flexible film 120 with its conductor line and raised pad pattern may be fabricated in a similar manner to that described above with respect to film 50. Use of the artwork used to fabricate the IC die pad terminals to locate the positions of the raised pads 124 readily ensures the fabrication of the appropriate pattern of raised pads 124.

The holder bracket 140 and spring-loaded threaded studs 150 provide a means for urging the IC die against the upper surface 120a of the film 120. The studs 150 extend through openings 142 formed in bracket 140 and are fitted into threaded bores 118 formed in the interface board 110, as shown in further detail in FIG. 9. Coiled springs 152 provided a means for exerting a force on the holder bracket 140. As shown in FIG. 9, a recess 128 is formed in the board 110 between the studs 150, and a layer 129 of resilient high temperature rubber is fitted into the recess. The thickness of the rubber layer 129 matches the depth of the recess 128.

A slot opening 144 is formed in holder the bracket 140 to facilitate insertion of the IC die 170 beneath bracket 140 and allow access to it while disposed under the bracket. With the bracket 140 lifted against the bias of the springs 152, the operator employs a probe 160 with a vacuum gripper to position the IC die on the surface of the film 120. The bracket 140 is then lowered onto the IC die 140 to exert a force urging the die 140 against the surface of the film 120. The force exerted by the springs is not so great as to prevent the die from being moved laterally to position it relative to the raised pads 124 on the film 124. The operator will determine through tactile sensations when the die terminals are disposed in contact with the raised pads of the film 120. The rubber layer 129 provides a resilient support to the film, allowing the film to conform to the contour of the lower surface 172 of the die 170. In this manner, the die 170 is secured for subsequent electrical testing.

Once the testing is completed, the bracket 140 may be lifted against the force of the springs 152, and the die removed by the probe 160. Thus, the die 170 may be quickly and easily inserted and removed from the apparatus 100.

To provided the capability for testing while temperature cycling the IC die, a heater element may be disposed in the bracket 140; such an element is shown schematically as resistive element 180 in FIGS. 8 and 9.

The flexible film 120 is shown in further detail in the top plan view of FIG. 10. The edge portions 120c and 120d are folded along respective fold lines 127a and 127b, and disposed under the main portions 120e of the film as shown in FIGS. 8 and 9. The position of the film in relation to the interface board is registered by the insertion of the alignment pins 112 through corresponding openings formed in the film 120.

The apparatus 100 provides the capability of making secure connections to the terminal pads of an IC die without the use of fragile wire wiskers or probes, wire bonds or solder connections. The apparatus may be readily and inexpensively adapted to electrically connect to different IC die configurations simply by changing the film 120; a different film 120 is fabricated for each die configuration.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. An apparatus for providing bondless electrical contact to a rigid miniaturized electronic component holding device having a plurality of contact terminals located in a predetermined pattern on a surface of said device, comprising:
   a flexible film having a conductive wiring pattern formed thereon, said wiring pattern including a first set of conductive pads formed thereon extending above the surface of said film in a pattern corresponding to said device contact terminal pattern and a plurality of conductor lines connecting to respective ones of said first set of conductive pads;
   means for urging said flexible film against said surface of said electrical device with said respective ones of said first set of conductive pads aligned with corresponding ones of said device terminals so that electrical contact is achieved between said device terminals and said first set of conductive pads of said film, said means for urging said flexible film against said surface of said electrical device including;
   (i) a first connector structural member of resilient material having a first surface of contour substantially conforming to said device surface, and supporting said flexible film;
   (ii) a second connector structural member supporting said electrical device with said device terminals substantially exposed;
   (iii) means for releaseably engaging said flexible film between said second member and said first connector structural member with said exposed surface of said electrical device against said flexible film; and
   (iv) means for aligning said device contact terminals with said raised film pads while said exposed surface of said electrical device is urged against said flexible film; and,
   means for electrically connecting to said respective conductor lines formed on said film to provide electrical contact to said electrical device through said respective conductor lines and said first set of conductive pads.

2. The apparatus of claim 1 wherein said electrical device comprises a leadless integrated circuit carrier.

3. The apparatus of claim 1 wherein said electrical device comprises an integrated circuit die.

4. The apparatus of claim 3 wherein said means for releasably urging said second structural member toward said first structural member comprises a pair of spring clip members arranged for pivoting movement at opposing edges of said first structural member, said clip members arranged for securing said second member adjacent said first member when said clip members are engaged with said second members.

5. The apparatus of claim 1 wherein said means for electrically connecting to said respective conductor lines comprises:
   (i) a second set of raised conductive pads formed in a predetermined pattern on said conductor lines on said surface of said flexible film adjacent at least a first end of said film;
   (ii) an interface board having a pattern of conductor lines formed on a surface thereof;
   (iii) said first end of said film being folded under said film so that the portions of said film surface bearing said second set of pads faces in an opposing direction to that portion of the film surface bearing said first set of pads;
   (iv) means for urging said portions of said film surface bearing said second set of conductive pads against said surface of said interface board having the pattern of conductor lines; and
   (v) means for aligning the position of the film relative to the conductor lines formed on said interface board so that said respective ones of said second set of pads on said film are in electrical contact with corresponding ones of said conductor lines formed on said interface board.

6. The apparatus of claim 5 wherein said means for urging said portions of said film surface against said surface of said interface board comprises fastener means for securing said first structural member against said surface of said interface board with said first end of said film interposed therebetween.

7. The apparatus of claim 5 wherein said means for aligning said device contact terminals with said raised pads and said means for aligning the position of the film relative to the conductor lines formed on said interface board comprises:
 (i) a plurality of alignment pins extending from said surface of said interface board; and
 (ii) a corresponding plurality of alignment openings formed at predetermined locations through said respective first connector structural member, said second connector structural member and said flexible film, said alignment openings for receiving said respective alignment pins therethrough to align the respective positions of said first and second structural members and said film relative to said interface board.

8. The apparatus of claim 1 wherein said flexible film is fabricated from a polyimide material.

9. An apparatus for providing electrical contact to an integrated circuit (IC) die having a plurality of contact terminals in a predetermined pattern on a surface of said device, comprising:
 a flexible film member having a pattern of conductor lines formed thereon, each line terminating at respective first and second ends, and a first set of raised conductive pads extending from respective ones said conductor lines adjacent said first ends thereof in a pattern substantially coinciding with said predetermined pattern of said IC die contact terminals, said second ends of said conductor lines being disposed adjacent one or more edges of said film, said edge being folded under said film;
 an interface board having a pattern of second conductor lines formed thereon;
 means for resiliently urging said folded edge of said film against said surface of said interface board so that said second ends of said conductor lines on said film are in contact with corresponding ones of said conductor lines formed on said interface board;
 a first connector structural member of resilient material resiliently supporting that portion of said film underlying said IC die; and
 means for releaseably engaging said surface of said IC die bearing said contact terminals against said film with said contact terminals in contact with corresponding ones in said raised conductive pads on said film.

10. The apparatus of claim 9 further comprising means for aligning said interface board, said film and said die to align said die contact terminals with said raised pads on said film and to align said second ends of said conductor lines on said folded end of said film with corresponding ones of said conductor lines on said interface board.

11. The apparatus of claim 10 wherein said means for aligning said second ends of said conductor lines on said film with corresponding conductor lines on said interface board comprises a plurality of alignment pins extending from said board, and a corresponding plurality of alignment openings formed in said film through which said pins are received.

12. The apparatus of claim 10 wherein said means for aligning said contact terminals with said raised pads comprises a vacuum gripper.

13. The apparatus of claim 9 wherein said means for releaseably engaging said surface of said IC die against said film comprises means permitting rapid insertion in and removal of said IC die from said apparatus, said means comprising a holder bracket and means for urging said bracket toward said film surface while said IC die is disposed between said holder bracket and said surface of said film member.

14. The apparatus of claim 13 wherein said means for urging said bracket toward said film surface comprises a plurality of spring members.

15. The apparatus of claim 9 wherein said flexible film is fabricated from a polyimide material.

16. The apparatus of claim 9 further comprising means for heating said IC die while said die is urged against said film

* * * * *